United States Patent
Yang et al.

(10) Patent No.: US 8,339,874 B2
(45) Date of Patent: Dec. 25, 2012

(54) SEQUENCE DETECTION FOR FLASH MEMORY WITH INTER-CELL INTERFERENCE

(75) Inventors: Xueshi Yang, Sunnyvale, CA (US); Zining Wu, Los Altos, CA (US)

(73) Assignee: Marvell World Trade Ltd., St. Michael (BB)

( * ) Notice: Subject to any disclaimer, the term of this patent is extended or adjusted under 35 U.S.C. 154(b) by 0 days.

(21) Appl. No.: 13/335,037

(22) Filed: Dec. 22, 2011

(65) Prior Publication Data

US 2012/0099372 A1 Apr. 26, 2012

Related U.S. Application Data

(63) Continuation of application No. 12/191,616, filed on Aug. 14, 2008, now Pat. No. 8,085,605.

(60) Provisional application No. 60/968,741, filed on Aug. 29, 2007.

(51) Int. Cl.
*G11C 7/22* (2006.01)

(52) U.S. Cl. .............. 365/189.15; 365/191; 365/230.06; 365/239

(58) Field of Classification Search ............. 365/189.15, 365/191, 230.06, 239
See application file for complete search history.

(56) References Cited

U.S. PATENT DOCUMENTS

| | | | |
|---|---|---|---|
| 4,805,140 A * | 2/1989 | Grimes et al. | ................... 365/87 |
| 6,279,133 B1 | 8/2001 | Vafai et al. | |
| 6,501,812 B1 | 12/2002 | Yada | |
| 7,877,564 B2 | 1/2011 | Eldredge et al. | |
| 2007/0067704 A1 | 3/2007 | Altintas et al. | |
| 2007/0171730 A1 | 7/2007 | Ramamoorthy et al. | |

FOREIGN PATENT DOCUMENTS

| | | |
|---|---|---|
| GB | 2 418 820 | 4/2006 |
| WO | WO 2007/132453 | 11/2007 |

OTHER PUBLICATIONS

The International Search Report and Written Opinion of the International Searching Authority, or the Declaration mailed Mar. 3, 2009, for Inernational Application No. PCT/US2008/074414, filed Aug. 27, 2008; 13 pages.

\* cited by examiner

*Primary Examiner* — Thong Q Le

(57) ABSTRACT

A memory integrated circuit (IC) includes a read module and a sequence detector module. The read module reads S memory cells (cells) located along one of a bit line and a word line and generates S read signals, where S is an integer greater than 1. The sequence detector module detects a data sequence based on the S read signals and reference signals. The data sequence includes data stored in the S cells. Each of the reference signals includes an interference-free signal associated with one of the S cells and an interference signal associated with another of the S cells that is adjacent to the one of the S cells.

20 Claims, 11 Drawing Sheets

(12) United States Patent
US 8,339,874 B2

SEQUENCE DETECTION FOR FLASH MEMORY WITH INTER-CELL INTERFERENCE

CROSS-REFERENCE TO RELATED APPLICATIONS

This application is a continuation of U.S. application Ser. No. 12/191,616, filed on Aug. 14, 2008 (now U.S. Pat. No. 8,085,605), which claims the benefit of U.S. Provisional Application No. 60/968,741, filed on Aug. 29, 2007. The disclosures of the above applications are incorporated herein by reference in their entirety.

FIELD

The present disclosure relates to semiconductor memory, and more particularly to estimating data stored in semiconductor memory using sequence detection when inter-cell interference is present.

BACKGROUND

The background description provided herein is for the purpose of generally presenting the context of the disclosure. Work of the presently named inventors, to the extent the work is described in this background section, as well as aspects of the description that may not otherwise qualify as prior art at the time of filing, are neither expressly nor impliedly admitted as prior art against the present disclosure.

Semiconductor memory (memory) that stores binary data is generally of two types: volatile and nonvolatile. Volatile memory loses stored data when power to the memory is turned off. Nonvolatile memory, on the other hand, retains stored data even when power to the memory is turned off.

Memory is typically packaged in memory integrated circuits (ICs). Memory ICs comprise memory arrays. Memory arrays include rows and columns of memory cells (cells). Cells store binary data (bits). Cells of memory such as flash memory and phase change memory can store more than one bit per cell.

Referring now to FIG. 1, an exemplary memory IC 10 is shown. The memory IC 10 comprises a memory array 12, a bit line decoder 14, a word line decoder 16, and a control module 18. The memory array 12 comprises (m+1)=M rows and (n+1)=N columns of (M*N) cells 20, where m and n are integers greater than 1. Each of the M rows includes N cells. The bit line decoder 14 selects N columns of cells 20 via bit lines BL0-BLn. The word line decoder 16 selects M rows of cells 20 via word lines WL0-WLm.

The control module 18 comprises an address control module 22 and a read/write (R/W) control module 24. The address control module 22 controls addressing of the cells 20 via the bit line decoder 14 and the word line decoder 16. The R/W control module 24 controls R/W operations of the cells 20 via the bit line decoder 14 and the word line decoder 16.

The memory IC 10 communicates with a host 26 via a bus 28. The bus 28 comprises address, data, and control lines. The host 26 issues R/W and control instructions to the memory IC 10 via the bus 28 when reading and writing data from and to the cells 20. The control module 18 reads and writes data from and to the cells 20 based on the R/W and control instructions.

SUMMARY

A memory integrated circuit (IC) comprises a read module and a sequence detector module. The read module reads S memory cells (cells) located along one of a bit line and a word line and generates S read signals, where S is an integer greater than 1. The sequence detector module detects a data sequence based on the S read signals and reference signals. The data sequence includes data stored in the S cells. Each of the reference signals includes an interference-free signal associated with one of the S cells and an interference signal associated with another of the S cells that is adjacent to the one of the S cells.

In another feature, the S cells each store N bits of data, where N is an integer greater than or equal to 1.

In another feature, the S cells include NAND flash cells.

In another feature, each of the reference signals includes another interference signal associated with yet another of the S cells that is adjacent to the one of the S cells and that is different than the other of the S cells.

In another feature, the sequence detector module detects the data sequence using one of a Viterbi detector, a decision feedback equalizer (DFE), and a fixed-depth delay tree search with DFE.

In another feature, the memory IC further comprises a reference generator module that generates the reference signals by writing reference data to the S cells and by reading back the S cells.

In another feature, the reference generator module generates the reference signals using a lookup table.

In another feature, the sequence detector module further comprises a trellis generator module that generates a trellis that includes states each comprises data from an $i^{th}$ and an $(i+1)^{th}$ of the S cells, where $1 \leq i \leq S$.

In other features, the sequence detector module further comprises a trellis initialization module that initializes the trellis based on a first of the S read signals and the reference signals corresponding to the first of the S cells. The trellis initialization module generates initial path metrics for paths of the trellis. The paths selectively connect the states.

In another feature, the initial path metrics include squared Euclidean distances between the first of the S read signals generated by the read module by reading the first of the S cells and the reference signals corresponding to the first of the S cells.

In other features, the sequence detector module further comprises a branch metric generator module that generates branch metrics for branches of the trellis. The branches connect one of the states to another of the states when the one of the states transitions to another of the states based on the S read signals.

In another feature, the branch metrics include squared Euclidean distances between ones of the S read signals generated by the read module by reading a second through a penultimate of the S cells and ones of the reference signals corresponding to the second through the penultimate of the S cells.

In other features, the sequence detector module further comprises a trellis termination module that terminates the trellis based on a last of the S read signals and the reference signals corresponding to the last of the S cells. The trellis termination module generates final branch metrics.

In another feature, the final branch metrics include squared Euclidean distances between the last of the S read signals generated by the read module by reading the last of the S cells and the reference signals corresponding to the last of the S cells.

In another feature, the sequence detector module further comprises a path metric generator module that generates cumulative path metrics based on the initial path metrics, the branch metrics, and the final branch metrics.

In another feature, the sequence detector module further comprises a survivor path selection module that selects one of the paths having a smallest of the cumulative path metrics as a survivor path.

In other features, the sequence detector module further comprises a state selection module that selects a sequence of S of the states that are connected by the survivor path. The state selection module generates the data sequence from the sequence of S of the states.

In another feature, the sequence detector module further comprises a survivor path selection module that selects one of the paths having a smallest of the cumulative path metrics as a survivor path before the trellis is terminated.

In other features, the sequence detector module further comprises a state selection module that selects a sequence of less than S of the states that are connected by the survivor path. The state selection module generates the data sequence from the sequence of less than S of the states.

In another feature, the data sequence includes an at least S-bit word of the data when the S cells are located along the word line.

In other features, the memory IC includes N bit lines and the S cells are located along each of the N bit lines, where N is an integer greater than 1. The sequence detector generates N data sequences when the read module reads the S cells located along the N bit lines and generates S N-bit words. The trellis generator module generates the trellis for each of the N bit lines.

In still other features, a method comprises reading S memory cells (cells) located along one of a bit line and a word line, and generating S read signals, where S is an integer greater than 1. The method further comprises generating reference signals comprising an interference-free signal associated with one of the S cells and an interference signal associated with another of the S cells that is adjacent to the one of the S cells. The method further comprises detecting a data sequence based on the S read signals and the reference signals. The data sequence includes data stored in the S cells.

In another feature, the method further comprises storing N bits of data in each one of the S cells, where N is an integer greater than or equal to 1.

In another feature, the method further comprises generating the reference signals that include another interference signal associated with yet another of the S cells that is adjacent to the one of the S cells and that is different than the other of the S cells.

In another feature, the method further comprises detecting the data sequence using one of a Viterbi detector, a decision feedback equalizer (DFE), and a fixed-depth delay tree search with DFE.

In another feature, the method further comprises generating the reference signals by writing reference data to the S cells and by reading back the S cells.

In another feature, the method further comprises generating the reference signals using a lookup table.

In another feature, the method further comprises generating a trellis that includes states each comprises data from an $i^{th}$ and an $(i+1)^{th}$ of the S cells, where $1 \leq i \leq S$.

In other features, the method further comprises initializing the trellis based on a first of the S read signals and the reference signals corresponding to the first of the S cells. The method further comprises generating initial path metrics for paths of the trellis, and selectively connecting the states by the paths.

In another feature, the method further comprises generating the initial path metrics that include squared Euclidean distances between the first of the S read signals generated by reading the first of the S cells and the reference signals corresponding to the first of the S cells.

In other features, the method further comprises generating branch metrics for branches of the trellis. The method further comprises connecting one of the states to another of the states by the branches when the one of the states transitions to the other of the states based on the S read signals.

In another feature, the method further comprises generating the branch metrics that include squared Euclidean distances between ones of the S read signals generated by reading a second through a penultimate of the S cells and ones of the reference signals corresponding to the second through the penultimate of the S cells.

In another feature, the method further comprises terminating the trellis based on a last of the S read signals and the reference signals corresponding to the last of the S cells, and generating final branch metrics.

In another feature, the method further comprises generating the final branch metrics that include squared Euclidean distances between the last of the S read signals generated by reading the last of the S cells and the reference signals corresponding to the last of the S cells.

In another feature, the method further comprises generating cumulative path metrics based on the initial path metrics, the branch metrics, and the final branch metrics.

In another feature, the method further comprises selecting one of the paths having a smallest of the cumulative path metrics as a survivor path.

In another feature, the method further comprises selecting a sequence of S of the states that are connected by the survivor path, and generating the data sequence from the sequence of S of the states.

In another feature, the method further comprises selecting one of the paths having a smallest of the cumulative path metrics as a survivor path before terminating the trellis based on the last of the S read signals and the reference signals corresponding to the last of the S cells.

In another feature, the method further comprises selecting a sequence of less than S of the states that are connected by the survivor path, and generating the data sequence from the sequence of less than S of the states.

In another feature, the method further comprises generating the data sequence that includes an at least S-bit word of the data when the S cells are located along the word line.

In other features, the method further comprises reading the S cells that are located along each of N bit lines, where N is an integer greater than 1. The method further comprises generating N data sequences and generating S N-bit words. The method further comprises generating the trellis for each of the N bit lines.

In still other features, a memory integrated circuit (IC) comprises reading means for reading S memory cells (cells) located along one of a bit line and a word line and for generating S read signals, where S is an integer greater than 1. The memory IC further comprises sequence detector means for detecting a data sequence based on the S read signals and reference signals. The data sequence includes data stored in the S cells. Each of the reference signals includes an interference-free signal associated with one of the S cells and an interference signal associated with another of the S cells that is adjacent to the one of the S cells.

In another feature, the S cells each store N bits of data, where N is an integer greater than or equal to 1.

In another feature, the S cells include NAND flash cells.

In another feature, each of the reference signals includes another interference signal associated with yet another of the S cells that is adjacent to the one of the S cells and that is different than the other of the S cells.

In another feature, the sequence detector means detects the data sequence using one of Viterbi detector means for detecting the data sequence, decision feedback equalizer (DFE) means for detecting the data sequence, and fixed-depth delay tree search with DFE means for detecting the data sequence.

In another feature, the memory IC further comprises reference generator means for generating the reference signals by writing reference data to the S cells and by reading back the S cells.

In another feature, the reference generator means generates the reference signals using a lookup table.

In another feature, the sequence detector means further comprises trellis generator means for generating a trellis that includes states each comprises data from an $i^{th}$ and an $(i+1)^{th}$ of the S cells, where $1 \leq i \leq S$.

In other features, the sequence detector means further comprises trellis initialization means for initializing the trellis based on a first of the S read signals and the reference signals corresponding to the first of the S cells. The trellis initialization means generates initial path metrics for paths of the trellis. The paths selectively connect the states.

In another feature, the initial path metrics include squared Euclidean distances between the first of the S read signals generated by the reading means by reading the first of the S cells and the reference signals corresponding to the first of the S cells.

In other features, the sequence detector means further comprises branch metric generator means for generating branch metrics for branches of the trellis. The branches connect one of the states to another of the states when the one of the states transitions to the other of the states based on the S read signals.

In another feature, the branch metrics include squared Euclidean distances between ones of the S read signals generated by the reading means by reading a second through a penultimate of the S cells and ones of the reference signals corresponding to the second through the penultimate of the S cells.

In other features, the sequence detector means further comprises trellis termination means for terminating the trellis based on a last of the S read signals and the reference signals corresponding to the last of the S cells. The trellis termination means generates final branch metrics.

In another feature, the final branch metrics include squared Euclidean distances between the last of the S read signals generated by the reading means by reading the last of the S cells and the reference signals corresponding to the last of the S cells.

In another feature, the sequence detector means further comprises path metric generator means for generating cumulative path metrics based on the initial path metrics, the branch metrics, and the final branch metrics.

In another feature, the sequence detector means further comprises survivor path selection means for selecting one of the paths having a smallest of the cumulative path metrics as a survivor path.

In another feature, the sequence detector means further comprises state selection means for selecting a sequence of S of the states that are connected by the survivor path and for generating the data sequence from the sequence of S of the states.

In another feature, the sequence detector means further comprises survivor path selection means for selecting one of the paths having a smallest of the cumulative path metrics as a survivor path before the trellis is terminated.

In another feature, the sequence detector means further comprises state selection means for selecting a sequence of less than S of the states that are connected by the survivor path and for generating the data sequence from the sequence of less than S of the states.

In another feature, the data sequence includes an at least S-bit word of the data when the S cells are located along the word line.

In another feature, the memory IC includes N bit lines and the S cells are located along each of the N bit lines, where N is an integer greater than 1. The sequence detector means generates N data sequences when the reading means reads the S cells located along the N bit lines and generates S N-bit words. The trellis generator means generates the trellis for each of the N bit lines.

In still other features, a computer program executed by a processor comprises reading S memory cells (cells) located along one of a bit line and a word line, and generating S read signals, where S is an integer greater than 1. The computer program further comprises generating reference signals comprising an interference-free signal associated with one of the S cells and an interference signal associated with another of the S cells that is adjacent to the one of the S cells. The computer program further comprises detecting a data sequence based on the S read signals and the reference signals. The data sequence includes data stored in the S cells.

In another feature, the computer program further comprises storing N bits of data in each one of the S cells, where N is an integer greater than or equal to 1.

In another feature, the computer program further comprises generating the reference signals that include another interference signal associated with yet another of the S cells that is adjacent to the one of the S cells and that is different than the other of the S cells.

In another feature, the computer program further comprises detecting the data sequence using one of a Viterbi detector, a decision feedback equalizer (DFE), and a fixed-depth delay tree search with DFE.

In another feature, the computer program further comprises generating the reference signals by writing reference data to the S cells and by reading back the S cells.

In another feature, the computer program further comprises generating the reference signals using a lookup table.

In another feature, the computer program further comprises generating a trellis that includes states each comprises data from an $i^{th}$ and an $(i+1)^{th}$ of the S cells, where $1 \leq i \leq S$.

In other features, the computer program further comprises initializing the trellis based on a first of the S read signals and the reference signals corresponding to the first of the S cells. The computer program further comprises generating initial path metrics for paths of the trellis, and selectively connecting the states by the paths.

In another feature, the computer program further comprises generating the initial path metrics that include squared Euclidean distances between the first of the S read signals generated by reading the first of the S cells and the reference signals corresponding to the first of the S cells.

In other features, the computer program further comprises generating branch metrics for branches of the trellis. The computer program further comprises connecting one of the states to another of the states by the branches when the one of the states transitions to the other of the states based on the S read signals.

In another feature, the computer program further comprises generating the branch metrics that include squared Euclidean distances between ones of the S read signals generated by reading a second through a penultimate of the S cells and ones of the reference signals corresponding to the second through the penultimate of the S cells.

In another feature, the computer program further comprises terminating the trellis based on a last of the S read signals and the reference signals corresponding to the last of the S cells, and generating final branch metrics.

In another feature, the computer program further comprises generating the final branch metrics that include squared Euclidean distances between the last of the S read signals generated by reading the last of the S cells and the reference signals corresponding to the last of the S cells.

In another feature, the computer program further comprises generating cumulative path metrics based on the initial path metrics, the branch metrics, and the final branch metrics.

In another feature, the computer program further comprises selecting one of the paths having a smallest of the cumulative path metrics as a survivor path.

In another feature, the computer program further comprises selecting a sequence of S of the states that are connected by the survivor path, and generating the data sequence from the sequence of S of the states.

In another feature, the computer program further comprises selecting one of the paths having a smallest of the cumulative path metrics as a survivor path before terminating the trellis based on the last of the S read signals and the reference signals corresponding to the last of the S cells.

In another feature, the computer program further comprises selecting a sequence of less than S of the states that are connected by the survivor path, and generating the data sequence from the sequence of less than S of the states.

In another feature, the computer program further comprises generating the data sequence that includes an at least S-bit word of the data when the S cells are located along the word line.

In other features, the computer program further comprises reading the S cells that are located along each of N bit lines, where N is an integer greater than 1. The computer program further comprises generating N data sequences and generating S N-bit words. The computer program further comprises generating the trellis for each of the N bit lines.

Further areas of applicability of the present disclosure will become apparent from the detailed description, the claims and the drawings. It should be understood that the detailed description and specific examples are intended for purposes of illustration only and are not intended to limit the scope of the disclosure.

BRIEF DESCRIPTION OF THE DRAWINGS

The present disclosure will become more fully understood from the detailed description and the accompanying drawings, wherein.

DETAILED DESCRIPTION

Figure 1:
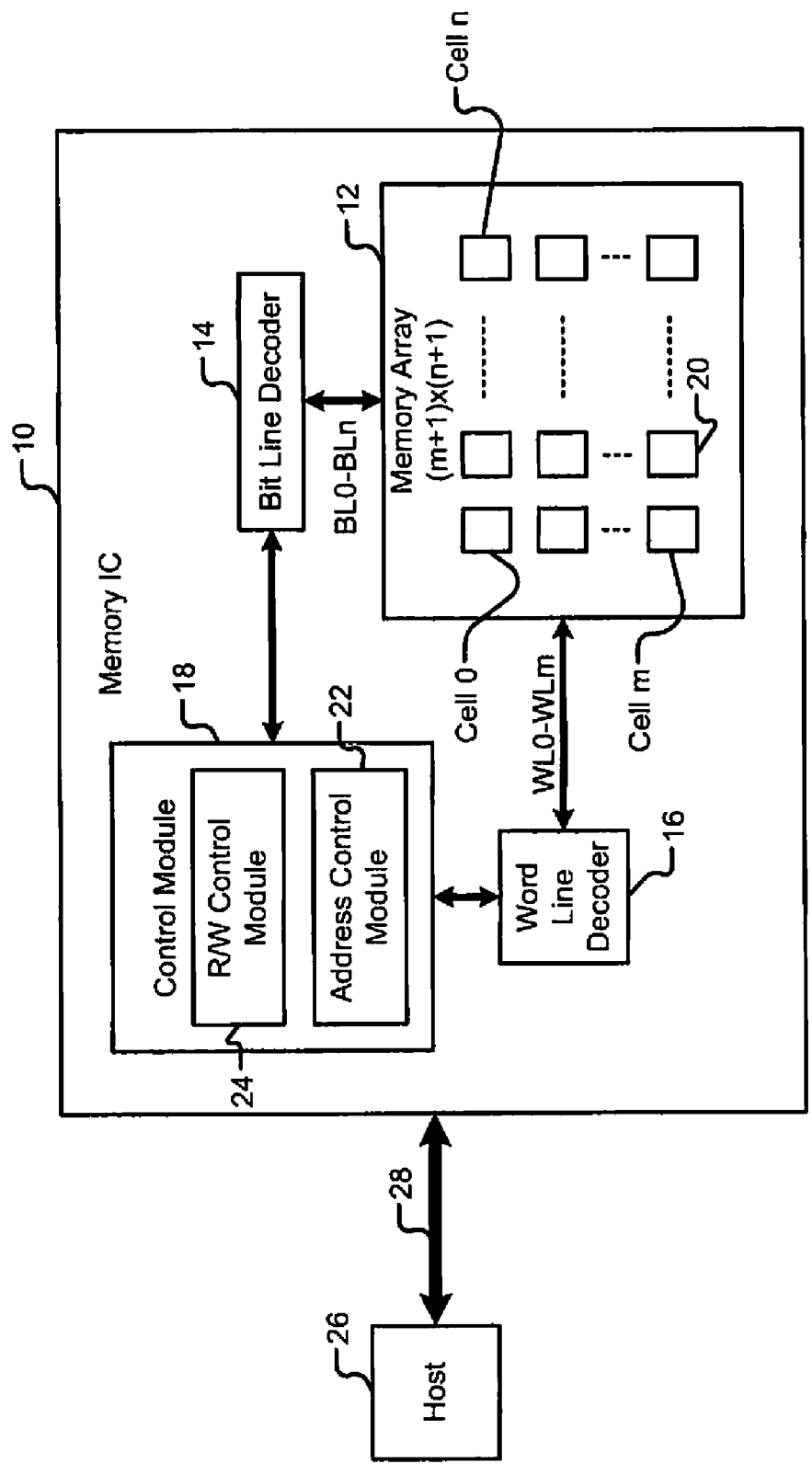
FIG. 1 is a functional block diagram of an exemplary memory integrated circuit (IC) according to the prior art.

The following description is merely exemplary in nature and is in no way intended to limit the disclosure, its application, or uses. For purposes of clarity, the same reference numbers will be used in the drawings to identify similar elements. As used herein, the phrase at least one of A, B, and C should be construed to mean a logical (A or B or C), using a non-exclusive logical or. It should be understood that steps within a method may be executed in different order without altering the principles of the present disclosure.

As used herein, the term module refers to an Application Specific Integrated Circuit (ASIC), an electronic circuit, a processor (shared, dedicated, or group) and memory that execute one or more software or firmware programs, a combinational logic circuit, and/or other suitable components that provide the described functionality.

Figure 2:
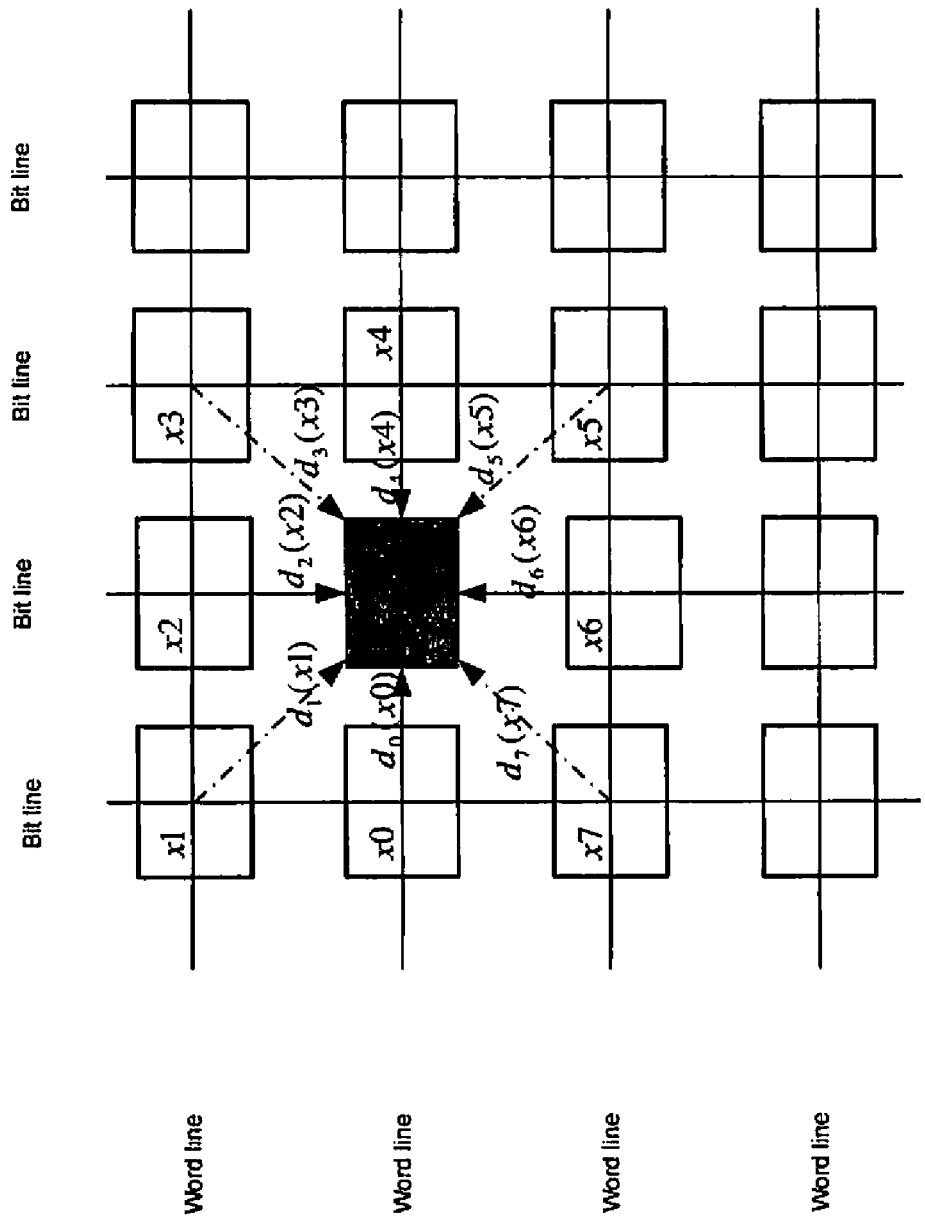
FIG. 2 is a schematic representation of a portion of a memory array.

Referring now to FIG. 2, a portion of a memory array comprising cells of a nonvolatile memory (e.g., NAND flash memory) is shown. When data stored in a target cell (shown shaded) is read, data stored in neighboring cells that are adjacent to the target cell may generate interference signals. The interference signals may interfere with a read signal that is generated when data stored in the target cell is read. The interference is called inter-cell interference and may cause the data in the target cell to be read incorrectly. The inter-cell interference increases as cell density of memory integrated circuits (ICs) increases and/or a number of bits stored per cell increases.

The inter-cell interference is data-dependent. That is, the inter-cell interference depends on the data stored in the target cell and/or the data stored in neighboring cells that are adjacent to the target cell. For example, when the target cell is read, the target cell may receive interference signals $d_i(x_i)$ from the neighboring cells i that store data $x_i$, respectively. The interference signals $d_i(x_i)$ may depend on the states of the data $x_i$ stored in the cells i. The interference signals $d_i(x_i)$ may cause the state of the target cell to be read incorrectly. Being data-dependent, the inter-cell interference may be linear or nonlinear.

Traditional nonvolatile memory systems (e.g., flash memory systems) ignore the inter-cell interference. Ignoring inter-cell interference, however, may trigger error-correction employed by the nonvolatile memory systems to fail. Error-correction failures, in turn, may degrade the performance of the nonvolatile memory systems.

The present disclosure proposes systems and methods for correctly estimating data stored in cells of nonvolatile memory using sequence detection when inter-cell interference is present. Unlike traditional systems that detect data stored in cells one cell at a time, the proposed systems and methods detect data stored in multiple cells at a time by collectively processing signals read from multiple cells.

The detailed description is organized as follows. First, a mathematical model for a read signal generated by reading the target cell that includes interference signals received from neighboring cells is presented. Next, an exemplary sequence detection scheme using the mathematical model, a trellis, and a Viterbi detector is discussed. Specifically, generating the trellis, initializing the trellis, terminating the trellis, generating path metrics and branch metrics, detecting a sequence of states along a selected path of the trellis, and estimating the data stored in cells from the sequence of states is discussed.

In most memory systems, the inter-cell interference may occur only in one dimension: along bit lines or along word lines. For example, in floating-gate NAND flash memory systems, the inter-cell interference due to parasitic capacitance coupling between floating gates occurs mainly in cells along bit lines. Cells located along a bit line may receive interference signals from neighboring cells located along the same bit line. Since metal shields are placed between adjacent bit lines, interference signals received by cells located along a bit line from cells located along neighboring bit lines may be attenuated. Thus, the inter-cell interference may exist mainly along bit lines. If, on the other hand, the metal shields are placed between adjacent word lines instead of between adjacent bit lines, the inter-cell interference may exist along word lines.

Accordingly, only one-dimensional inter-cell interference along bit lines is considered to simplify discussion. Additionally, since interference signals from cells beyond immediately neighboring cells along a bit line may diminish exponentially, the interference signals from non-immediate neighboring cells along the bit line are not considered. The interference signals from non-immediate neighboring cells, however, may be considered by extending the mathematical model of the read signal to include the interference signals from non-immediate neighboring cells.

The systems and methods of the present disclosure are discussed using memory systems having cells that store one bit per cell as an example only. The teachings of the present disclosure can be extended and made applicable to memory systems having cells that store more than 1 bit per cell.

A mathematical model for a noise-free read signal generated by reading a cell that includes one-dimensional inter-cell interference generated by immediate neighboring cells is now presented. A noise-free read signal generated by reading an $i^{th}$ cell (i.e., the target cell) along a bit line may be mathematically represented as follows.

$$s(x_i) = g(x_i) + d_0(x_{i-1}) + d_1(x_{i+1})$$

where $g(x_i)$ denotes an interference-free read signal that may be received from the $i^{th}$ cell if no inter-cell interference is present. $x_i$ denotes data stored in the $i^{th}$ cell. $d_0(x_{i-1})$ and $d_1(x_{i+1})$ denote interference signals received by the $i^{th}$ cell from the neighboring cells that are immediately adjacent to the $i^{th}$ cell along the same bit line and that store the data $x_{i-1}$ and $x_{i+1}$, respectively.

Figure 3:
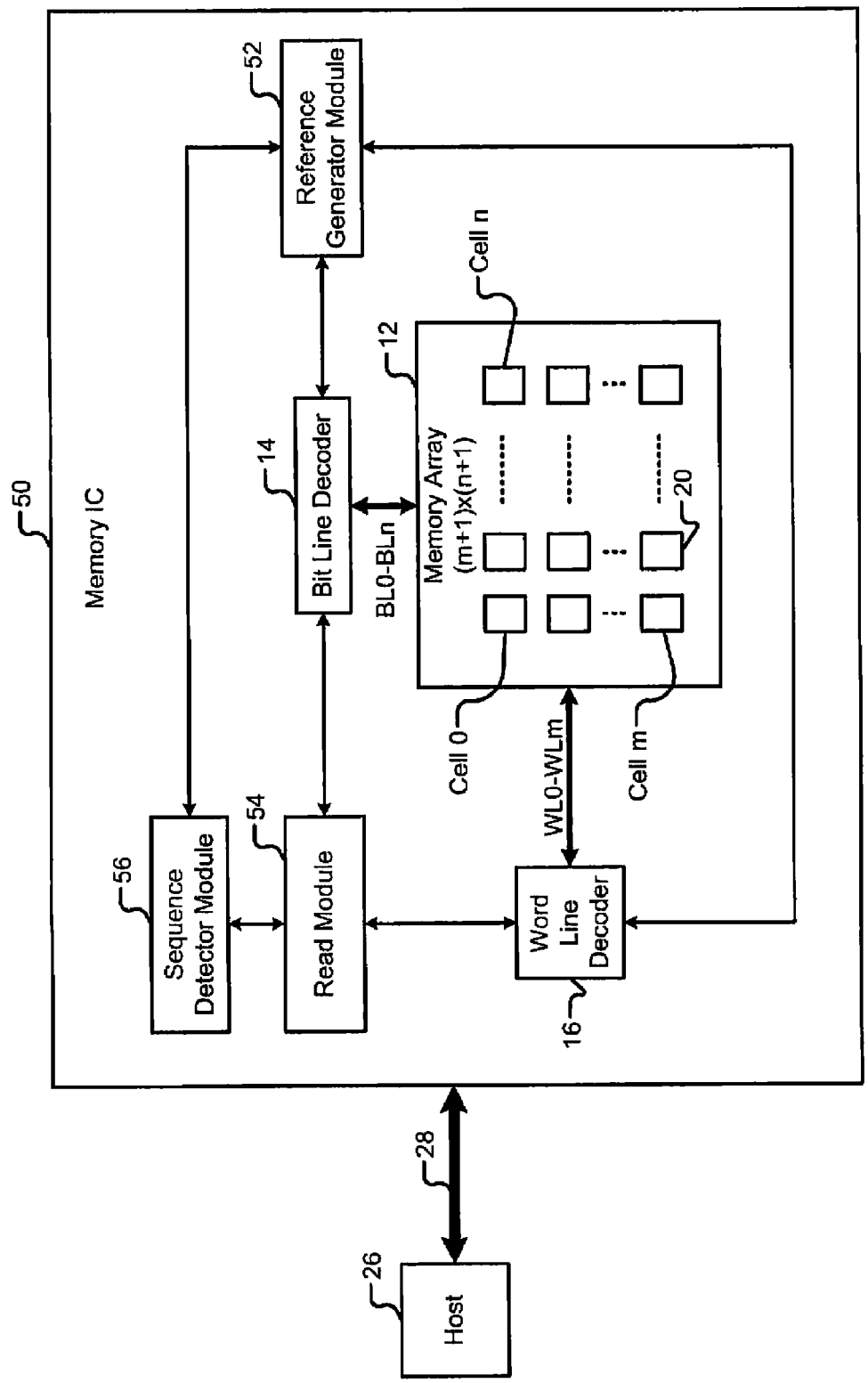
FIG. 3 is a functional block diagram of an exemplary system that detects data stored in memory using sequence detection according to the present disclosure.

Referring now to FIG. 3, a memory IC 50 comprising a system for detecting data stored in cells 20 using sequence detection is shown. The memory IC 50 comprises the memory array 12, the bit line decoder 14, the word line decoder 16, a reference generator module 52, a read module 54, and a sequence detector module 56. The reference generator module 52 generates reference signals that include all possible read signals that may be generated when the cells 20 are read during normal operation. The reference generator module 52 may generate the reference signals empirically or by using estimation. For example, the reference generator module 52 may generate the reference signals by writing different data combinations in adjacent cells and by reading the data combinations back from the adjacent cells. Accordingly, the reference signals can be generated via a predefined/programmable lookup table.

The read module 54 reads data stored in the cells 20 and generates read signals when read commands are received from the host 26 during normal operation. The sequence detector module 56 correctly detects data stored in the cells 20 based on the read signals and the reference signals using a sequence detector. The sequence detector may include a trellis and a Viterbi detector. Alternatively, the sequence detector may include a sequence detector such as a decision feedback equalizer (DFE) and a fixed-depth delay tree-search with DFE.

More specifically, the reference generator module 52 may generate the reference signals when the cells 20 are blank (e.g., when the memory IC 50 is manufactured). The reference generator module 52 may generate reference signals $s(x_i)$ by reading each of the cells 20 when $x_i$, $x_{i-1}$, and $x_{i+1}$ have different states. Values of the reference signals $s(x_i)$, called reference values, denote values of data stored in the cells 20 that include effects of inter-cell interference generated by different data stored in adjacent cells. Specifically, the reference values include effect on every possible data stored (e.g., a binary 0 or a binary 1) in each of the cells 20 along the bit lines due to every possible data stored in adjacent cells along the same bits lines.

For example, the reference generator module 52 may write a 0 in a first target cell along a first bit line and read back the first target cell to obtain a reference signal g(0) for the target cell when the adjacent cell is blank (i.e., in an erased state). g(0) is the interference-free read signal for the first target cell when a 0 is stored in the first target cell and when the adjacent cell is blank.

Next, the reference generator module 52 may write a 0 in a first neighboring cell that is adjacent to the first target cell along the same bit line and read back the first target cell to obtain a reference signal $s(0)=(g(0)+d_0(0))$. The reference signal s(0) generated by reading the first target cell having data 0 now includes g(0) and the interference signal $d_0(0)$ generated by the first neighboring cell having data 0.

When a target cell is neither the first nor the last cell along a bit line, the reference generator module 52 may write a 0 in a second neighboring cell that is adjacent to the target cell along the same bit line and read back the target cell to obtain a reference signal $s(0)=(g(0)+d_0(0)+d_1(0))$, and so on. The reference signal s(0) now additionally includes the interference signal $d_1(0)$ generated by the second neighboring cell having data 0.

The reference generator module 52 may write and read back all possible combinations of reference data (i.e., 0's and 1's) in each of the cells 20 and in corresponding neighboring cells along each bit line. The reference generator module 52 may generate reference signals $s(x_i)$ for each of the cells 20 when $x_i$, $x_{i-1}$, and $x_{i+1}$ have different states (i.e., 0's and 1's). Alternatively, or additionally, the reference generator module 52 may generate reference signals along the word lines. The reference generator module 52 may store the reference values of the reference signals.

Subsequently, when the read module 54 reads the data stored in the cells 20 during normal operation, the sequence detector module 56 uses the reference values that include all possible inter-cell interference that may occur when the read module 54 reads the data stored in the cells 20. Accordingly, the sequence detector module 56 correctly estimates data stored in the cells 20 when inter-cell interference is present.

As an example only, the read module 54 may read M cells along bit lines BL0-BLn, one bit line at a time, by selecting word lines WL0-WLm. The read module 54 may generate M read signals by reading M cells along each bit line. Alternatively, the read module 54 may read N cells along word lines WL0-WLm, one word line at a time. The read module 54 may generate N read signals by reading N cells along each word line.

The order of processing the cells 20 may be different from the order of reading the cells 20. Specifically, the order in which the sequence detector module 56 processes the cells 20 may be different than the order in which the read module 54 reads the cells 20. For example, in NAND flash, all the cells 20 along a selected word line are read at the same time whereas the sequence detector module 56 may process the cells 20 along a selected bit line at the same time.

As an example only, the sequence detector module 56 may utilize a trellis and a Viterbi detector for sequence detection. Alternatively, the sequence detector module 56 may use any other sequence detector including a decision feedback equalizer (DFE) and a fixed-depth delay tree-search with DFE.

Figure 4A:
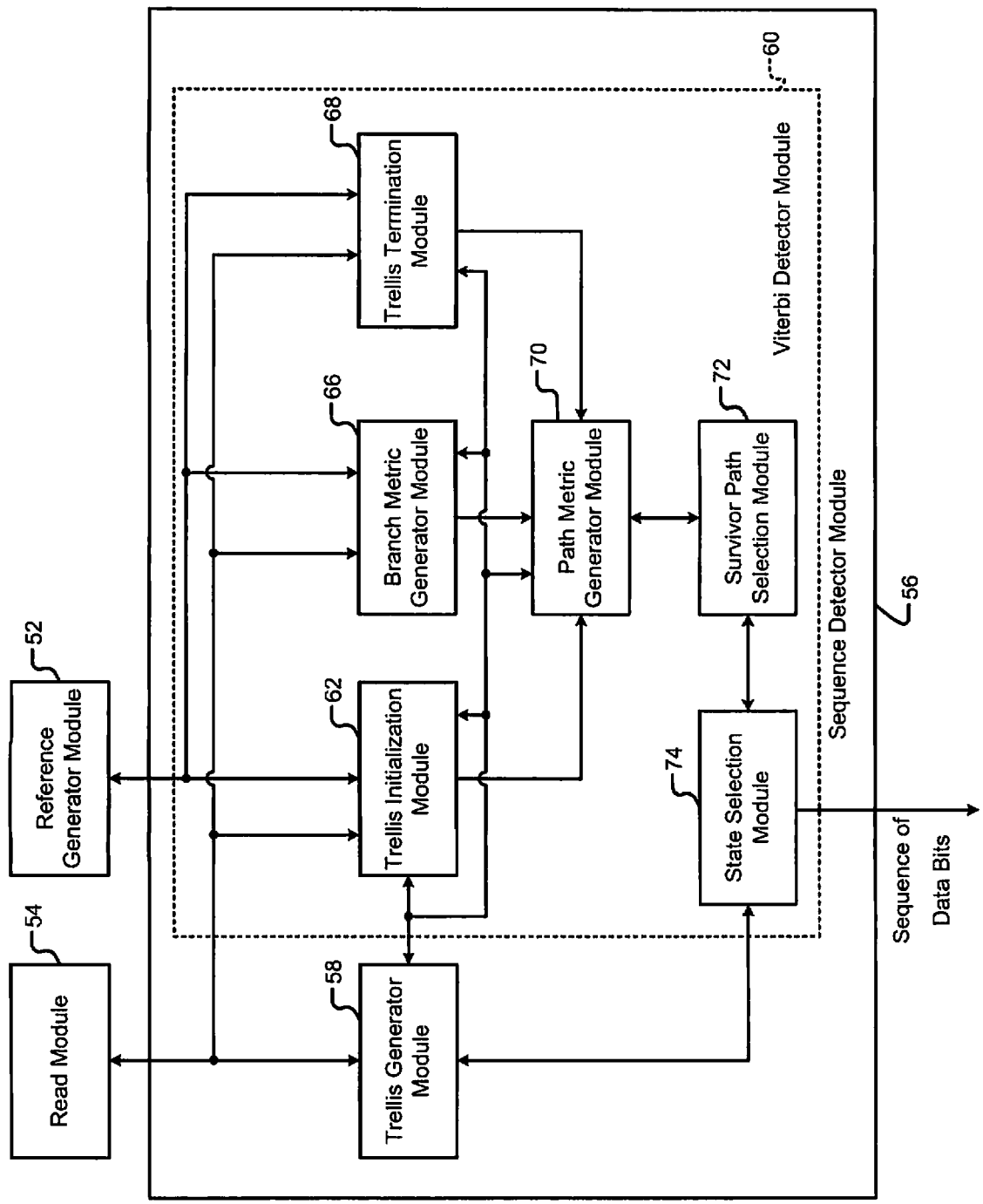
FIG. 4A is a functional block diagram of an exemplary sequence detector module used by the system of FIG. 3 according to the present disclosure.
Figure 4B:
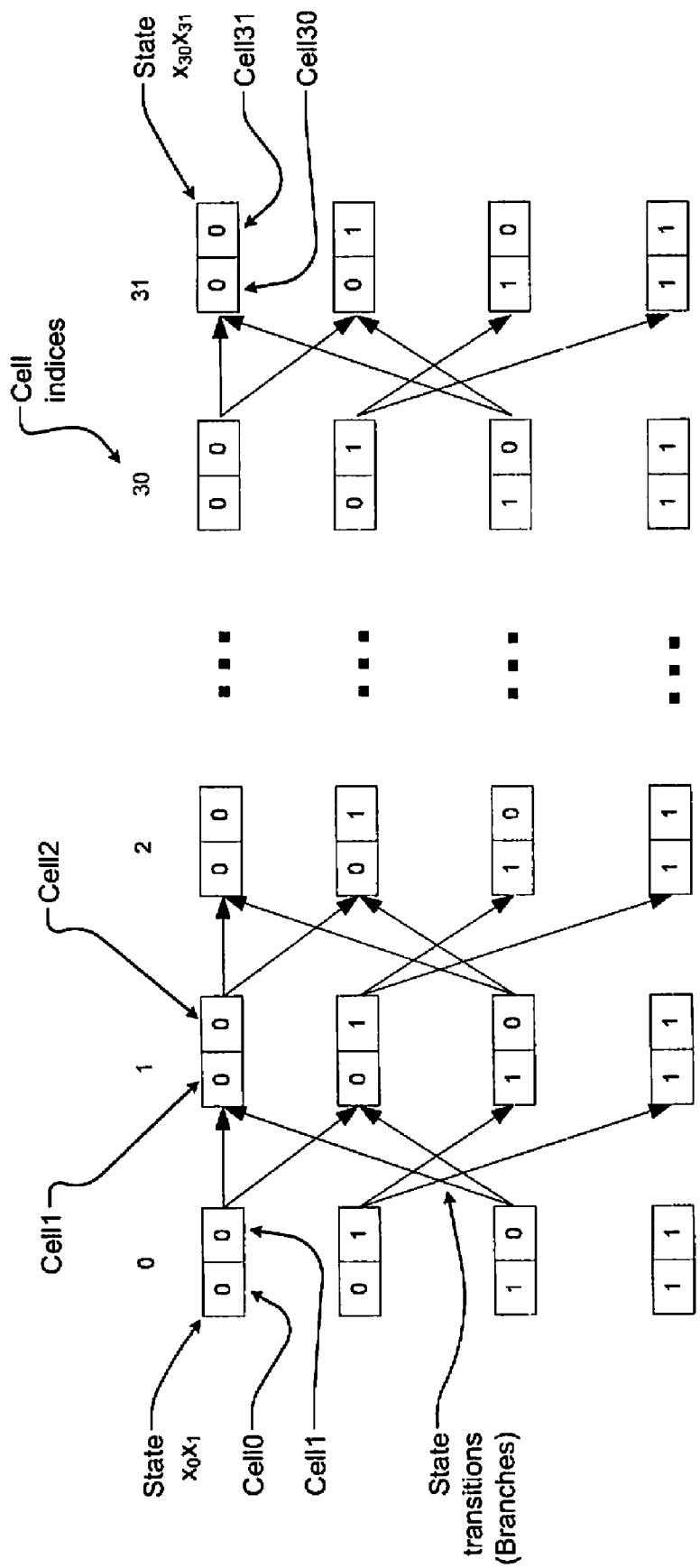
FIG. 4B is a schematic of a trellis used by the sequence detector module of FIG. 4A according to the present disclosure.

Referring now to FIGS. 4A and 4B, an exemplary sequence detector module 56 that utilizes a trellis and a Viterbi detector for sequence detection is shown. In FIG. 4A, the sequence detector module 56 may comprise a trellis generator module 58 and a Viterbi detector module 60. The Viterbi detector module 60 may comprise a trellis initialization module 62, a branch metric generator module 66, a trellis termination module 68, a path metric generator module 70, a survivor path selection module 72, and a state selection module 74.

The trellis generator module 58 may generate a trellis based on a number of cells (M) read by the read module 54 along each bit line during normal operation. Since all bit lines are typically read when a word line is selected to read a word, a separate trellis for each bit line may be concurrently generated when a word line is selected. Alternatively, the trellis generator module 58 may generate one trellis per word line based on N read signals generated by the read module 54 by reading N cells along a word line.

In FIG. 4B, an exemplary trellis generated by the trellis generator module 58 is shown. As an example, the memory array 12 may include 32 cells per bit line (i.e., M=32), and each of the 32 cells may store one bit of data. Accordingly, the trellis generator module 58 may generate the trellis shown for the 32 cells along a selected bit line. The numbers 0 through 31 shown denote cell indices for the 32 cells along the selected bit line.

In the example shown, the trellis may include 32 states. The states are indexed along the selected bit line. Each of the 32 states is defined by the data stored in a pair of adjacent cells along the selected bit line. Each of the adjacent cells in a pair (e.g., a pair comprising an $i^{th}$ and an $(i+1)^{th}$ of the 32 cells) may store either a 0 or a 1. Accordingly, each state (e.g., a state $x_i x_{i+1}$) may include one of four possible values (0,0), (0,1), (1,0), or (1,1) depending on the data stored in each of the adjacent cells of the pair. In memory systems that store more than 1 bit of data per cell, the number of possible states and subsequent processing may increase.

In the trellis, state transitions are defined as cell data changes with a moving window along the selected bit line. For example, a state transition occurs when a state $x_{i-1}x_i=00$ changes to a state $x_i x_{i+1}=01$, or when a state $x_{i-1}x_i=01$ changes to a state $x_i x_{i+1}=10$, etc. In other words, a state transition may occur when the $(i+1)^{th}$ cell stores a different data than the $i^{th}$ cell along the selected bit line.

Each state transition in the trellis is denoted by a branch. A branch connects a starting state to a destination state in the trellis. Each state except the initial state has at least one incoming branch. Each state except the final state has at least one outgoing branch. Each state is connected by a path from the initial state, where a path is a sequence of connected branches. States connected by a path form a sequence of states. Since the trellis shown may have four possible initial states, the trellis may have four possible paths.

The Viterbi detector module 60 generates path metrics, branch metrics, and cumulative path metrics based on Viterbi algorithm. Unlike traditional Viterbi detectors that process encoded data, the Viterbi detector module 60 processes unencoded data comprising the read signals generated by the read module 54 and the reference signals generated by the reference generator module 52. Additionally, unlike the traditional Viterbi detectors that process a stream of encoded data, the Viterbi detector module 60 processes segmented data. Specifically, each segment of data has a fixed length determined by the number of cells along the bit lines. Accordingly, each segment of data has initial and final boundaries determined by signals received from the first and last cells along each bit line.

The Viterbi detector module 60 selects a path of the trellis having a smallest cumulative path metric as a survivor path. The Viterbi detector module 60 detects a sequence of states connected by the survivor path. The Viterbi detector module 60 estimates data stored in the cells along the selected bit line based on the sequence of states connected by the survivor path.

The trellis initialization module 62 initializes the trellis at the beginning of each bit line. The trellis initialization module 62 initializes the trellis based on the first of the 32 read signals generated by the read module 54 by reading a first cell (i.e., cell with cell index i=0) of the selected bit line. The trellis initialization module 62 initializes the trellis by generating initial path metrics for each of the four possible paths of the trellis. The four possible paths begin at the four possible initial states (0,0), (0,1), (1,0), and (1,1) of the first and second cells (i.e., cells with cell indices i=0 and i=1), respectively. The first cell may receive inter-cell interference from only the second cell since the second cell is the only neighboring cell adjacent to the first cell.

The initial path metrics of the four paths are Squared Euclidean distances between a read signal generated by the read module 54 by reading the first cell during normal operation and the corresponding reference signals for the first cell. Specifically, the initial path metrics are Squared Euclidean distances between a read value of the read signal generated by the read module 54 by reading the first cell (i.e., $r_i$, where i=0) and corresponding reference values of the first cell (i.e., $s(x_i)$) generated by the reference generator module 52. When i=0, $d_0(x_{i-1})=0$ since the second cell is the only cell adjacent to the first cell.

The four initial path metrics generated by the trellis initialization module 62 may be mathematically expressed by the following equations.

$$p(00)=(r_0-(g(0)+d_1(0)))^2$$

$$p(01)=(r_0-(g(0)+d_1(1)))^2$$

$$p(10)=(r_0-(g(1)+d_1(0)))^2$$

$$p(11)=(r_0-(g(1)+d_1(1)))^2$$

In other words, the initial path metrics are the Squared Euclidean distances between the read signal $r_0$ read from the first cell during normal operation and a sum of two components generated during reference generation. The first component is the interference-free read signal of the first cell. The second component is the interference signal received by the first cell from the second cell. The values of the first and second components may vary depending on the data bits stored in the first and second cells during reference generation.

Specifically, the initial path metric p(00) is the Squared Euclidean distance between the read value of the read signal $r_0$ and the reference value of the reference signal $s(0)=(g(0)+d_1(0))$. The reference signal $s(0)$ is a sum of an interference-free read signal $g(0)$ generated by the first cell that stored a 0 and an interference signal $d_1(0)$ generated by the second cell that stored a 0 during reference generation.

The initial path metric p(01) is the Squared Euclidean distance between the read value of the read signal $r_0$ and the reference value of the reference signal $s(0)=(g(0)+d_1(1))$. The reference signal $s(0)$ is a sum of the interference-free read signal $g(0)$ generated by the first cell that stored a 0 and an interference signal $d_1(1)$ generated by the second cell that stored a 1 during reference generation.

The initial path metric p(10) is the Squared Euclidean distance between the read value of the read signal $r_0$ and the reference value of the reference signal $s(1)=(g(1)+d_1(0))$. The reference signal $s(1)$ is a sum of an interference-free read signal $g(1)$ generated by the first cell that stored a 1 and the interference signal $d_1(0)$ generated by the second cell that stored a 0 during reference generation.

Finally, the initial path metric p(11) is the Squared Euclidean distance between the read value of the read signal $r_0$ and the reference value of the reference signal $s(1)=(g(1)+d_1(1))$. The reference signal $s(1)$ is a sum of the interference-free read signal $g(1)$ generated by the first cell that stored a 1 and the interference signal $d_1(1)$ generated by the second cell that stored a 1 during reference generation.

The branch metric generator module 66 generates a branch metric for each branch in the trellis based on the read signals generated by the read module 54 and the respective reference signals generated by the reference generator module 52. A branch metric for a transition from a state $x_{i-1}x_i$ to a state $x_i x_{i+1}$ may be mathematically expressed by the following equation.

$$br(x_{i-1}x_i \to x_i x_{i+1}) = (r_i - (g(x_i) + d_0(x_{i-1}) + d_1(x_{i+1})))^2$$

For each i, the branch metric is a Squared Euclidean distance between the read signal $r_i$ generated by the read module 54 by reading the $i^{th}$ cell and the corresponding reference signal comprising a sum of three components generated during reference generation. The first component is the interference-free read signal received from the $i^{th}$ cell. The second component is the interference signal received by the $i^{th}$ cell from the $(i-1)^{th}$ cell. The third component is the interference signal received by the $i^{th}$ cell from the $(i+1)^{th}$ cell. The values of the three components may vary depending on the data bits stored in the $(i-1)^{th}$, $i^{th}$, and $(i+1)^{th}$ cells during reference generation.

The reference generator module 52 may not store the values of the three components $g(x_i)$, $d_0(x_{i-1})$ and $d_1(x_{i+1})$ separately. Instead, the reference generator module 52 stores the values of the sum of the three components indexed by the data of $x_i$, $x_{i-1}$, and $x_{i+1}$, which are used by the Viterbi detector module 60.

For each i from i=1 to i=30, the branch metric generator module 66 may generate branch metrics for all possible transitions from the state $x_{i-1}x_i$ to the state $x_i x_{i+1}$ since each of the states $x_{i-1}x_i$ and $x_i x_{i+1}$ can have one of four values (0,0), (0,1), (1,0), or (1,1). Specifically, the total number of possible transitions may be eight since for each of $x_i=0$ and $x_i=1$, $x_{i-1}$ and $x_{i+1}$ can have four possible values (0,0), (0,1), (1,0), and (1,1). Accordingly, as an example, the branch metric generator module 66 may generate branch metrics for transitions from state (0,0) to state (0,1), from state (0,1) to state (1,0), from state (1,0) to state (0,1), from state (1,1) to state (1,0), and so on.

When i=31, the trellis termination module 68 terminates the trellis by generating final branch metrics corresponding to a last state transition from a state $x_{29}x_{30}$ to a state $x_{30}x_{31}$ at the end of the selected bit line. The last cell of the selected bit line (i.e., the cell with cell index i=31) may receive inter-cell interference only from the penultimate cell (i.e., the cell with cell index i=30). Accordingly, the final branch metric may be mathematically expressed as follows.

$$br(x_{29}x_{30} \to x_{30}x_{31}) = (r_{31} - (g(x_{31}) + d_0(x_{30})))^2$$

Since the states comprising the last and the penultimate cells may include any of the four values (0,0), (0,1), (1,0), or (1,1), the trellis termination module 68 may generate four final branch metrics.

Each final branch metric is a Squared Euclidean distance between the read signal $r_{31}$ generated by the read module 54 by reading the $31^{st}$ cell (i.e., the last cell) and the corresponding reference signal comprising a sum of two components generated during reference generation. The first component is the interference-free read signal received from the $31^{st}$ cell. The second component is the interference signal received by the $31^{st}$ cell from the $30^{th}$ cell (i.e., the penultimate cell). The values of the first and second components may vary depending on the data bits stored in the last and the penultimate cells during reference generation.

At each i from i=1 to i=31, the path metric generator module 70 recursively generates cumulative (i.e., accumulated) path metrics for paths that enter each state. The path metric generator module 70 generates the cumulative path metrics using Viterbi algorithm.

Specifically, at the beginning of the trellis (i.e., at i=0), the path metric generator module 70 initializes the cumulative path metrics for the four possible paths starting at the four possible initial states (0,0), (0,1), (1,0), and (1,1) with the initial path metrics p(00), p(01), p(10), and p(11), respectively. Subsequently, at each i from i=1 to i=30, the path metric generator module 70 recursively adds branch metrics of each state to the cumulative path metrics of the paths that enter that state. Finally, when the trellis is terminated (i.e., at i=31), the path metric generator module 70 adds the final branch metrics of each state to the cumulative path metrics of the paths that enter that state.

After the trellis is terminated at i=31, the survivor path generator module 72 selects the path having the smallest cumulative path metric as the survivor path. The probability that the sequence of states at each i from i=0 to i=31 connected by the survivor path represent the most accurate estimates of the data read from the 32 cells along the selected bit line is highest. Accordingly, the state selection module 74 selects the sequence of states that are connected by the survivor path as representing the data read from the 32 cells along the selected bit line.

In some implementations, survivor path generator module 72 may select the path having the smallest cumulative path metric as the survivor path at any time. That is, the survivor path generator module 72 may select the path having the smallest cumulative path metric as the survivor path before the trellis is terminated at i=31. Accordingly, the state selection module 74 may select the sequence of states that are connected by the survivor path as representing the data read from some of the 32 cells along the selected bit line. The state selection module 74 may begin to output a detected data sequence of the 32 cells without waiting until the trellis is terminated at i=31. In other words, a decision delay in deciding the detected data sequence of the i cells can be less than i (e.g., i=32).

The state selection module 74 may generate 32 bits of data from the sequence of states connected by the survivor path. The 32 bits of data are accurate estimates of the data stored in the 32 cells although read by the read module 54 when inter-cell interference is present along the selected bit line. The state selection module 74 may store the 32 bits of data as the data read from the 32 cells along the selected bit line. The state selection module 74 may output a sequence of the 32 bits of data as the data read from the 32 cells along the selected bit line. Thus, the sequence detector module 56 jointly detects all 32 bits of data stored in the 32 cells along the selected bit line by collectively processing the read signals generated by the read module 54 by reading all the 32 cells along the selected bit line.

Thereafter, the read module 54 reads next 32 cells along a next bit line and generates new 32 read signals. The trellis initialization module 62 initializes the trellis by generating new initial path metrics based on the first of the new 32 read signals and the corresponding reference signal. The branch metric generator module 66 generates new branch metrics based on the new 32 read signals and the corresponding reference signal. The trellis termination module 68 terminates the trellis by generating new final branch metrics for the last transition along the next bit line based on the last of the new 32 read signals and the respective reference signal.

The path metric generator module 70 recursively generates cumulative path metrics based on the new initial path metrics, the new branch metrics, and the new final branch metrics using Viterbi algorithm. The survivor path selection module 72 generates a new survivor path having the smallest cumulative path metric. The state selection module 74 selects a new sequence of 32 states connected by the new survivor path, generates 32 bits of data from the 32 states, and stores/outputs the 32 data bits as the correct data read from the new 32 cells along the next bit line. The total number of data bits will be greater than 32 when the Viterbi algorithm described herein is extended and applied to cells that store more than one bit per cell.

Thus, the sequence detector module 56 detects data stored in M*N cells along N bit lines (i.e., in M N-bit wide words) by performing sequence detection N times (i.e., once for each bit line). The sequence detector module 56 may output the M N-bit wide words of data read from the cells 20, all M words at once. Alternatively, the sequence detector module 56 may detect data stored in M*N cells along M word lines (i.e., in M N-bit wide words) by performing sequence detection M times (i.e., once for each bit line). The sequence detector module 56 may output the M N-bit wide words of data read from the cells 20, one word at a time.

Occasionally, the inter-cell interference may occur in two dimensions: along N bit lines as well as along M word lines. The sequence detector module 56 may detect data stored in the cells 20 in many ways when two-dimensional inter-cell interference is present.

In one way, the trellis generator module 58 may generate a first trellis for bit lines and a second trellis for word lines. The sequence detector module 56 may use sequence detection to detect data bits stored in M cells along each of the N bit lines and generate N sets of M data bits, one set per bit line. Thereafter, the sequence detector module 56 may use sequence detection to detect data bits stored in N cells along each of the M word lines and generate M sets of N data bits, one set per word line, by utilizing the detection results obtained earlier for N bit lines.

The sequence detector module 56 may perform sequence detection iteratively using two classes of sequence detectors for bit lines and word lines. The sequence detectors may communicate with each other. The sequence detector module 56 may repeat sequence detection along all bit lines, one bit line at a time, followed by sequence detection along all word lines, one word line at a time, and so on. The sequence detector module 56 may repeat sequence detection along bit lines followed by sequence detection along word lines until data bits detected in all M*N cells by performing sequence detection along bit lines and word lines match.

Figure 5:
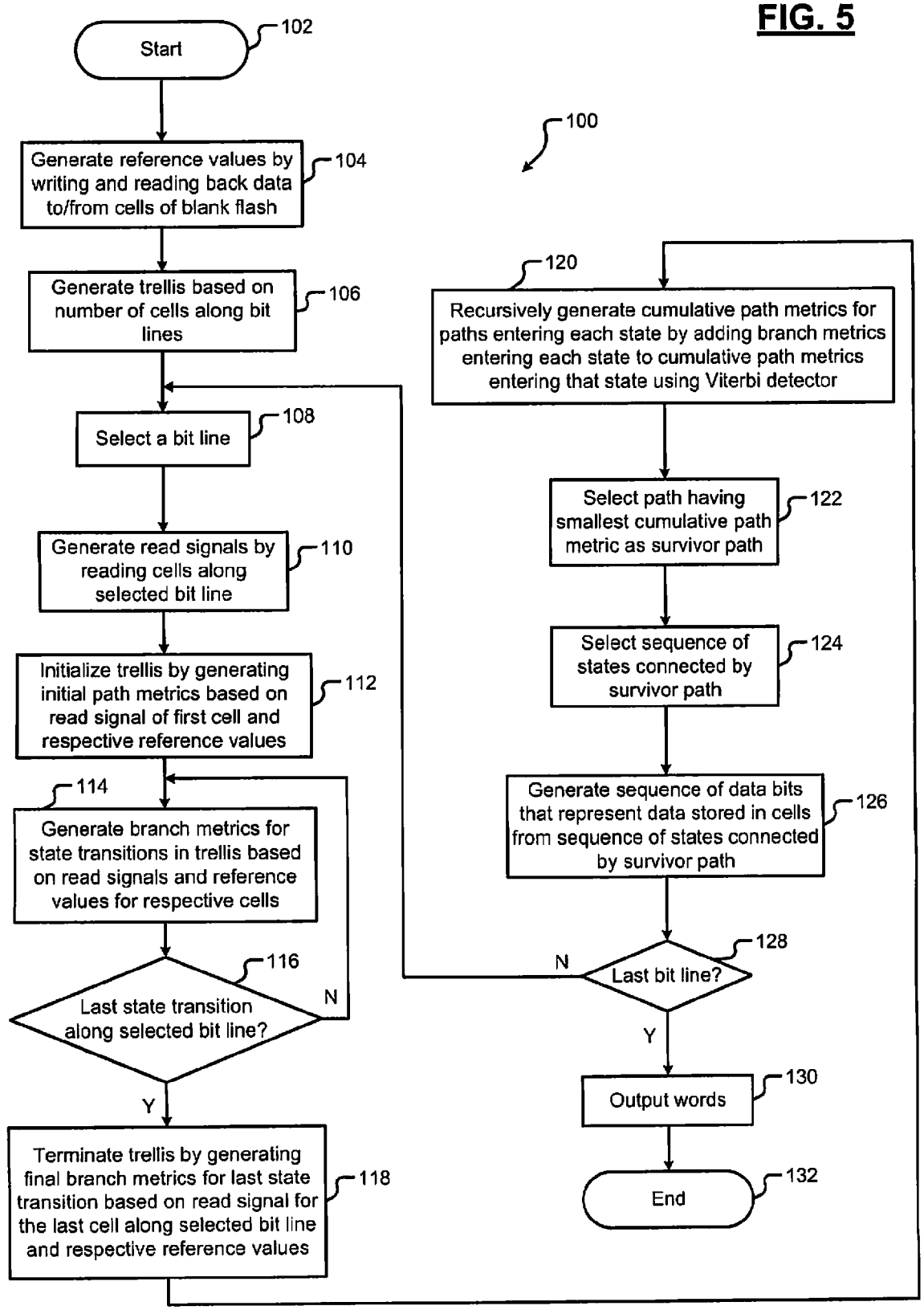
FIG. 5 is a flowchart of a method for detecting data stored in memory using sequence detection according to the present disclosure.

Referring now to FIG. 5, an exemplary method 100 for detecting data stored in non-volatile memory using sequence detection is shown. The method 100 detects the data when inter-cell interference is present along bit lines. The method 100 begins in step 102. In step 104, the reference generator module 52 writes and reads back all possible data combinations in the cells 20 when the cells 20 are blank and generates reference values for all possible read signals that the read module 54 may generate during normal operation. The trellis generator module 58 generates a trellis in step 106 based on the number of cells along the bit lines. The sequence detector module 56 selects one of the bit lines in step 108.

The read module 54 generates read signals by reading cells along the selected bit line in step 110. The trellis initialization module 62 initializes the trellis in step 112 by generating the initial path metrics p(00), p(01), p(10), and p(11) based on the read signal of the first cell along the selected bit line and respective reference values. The branch metric generator module 66 generates branch metrics for all branches (i.e., state transitions) in the trellis based on the read signals and respective the reference values in step 114.

The sequence detector module 56 determines in step 116 whether the state transition is the last state transition along the selected bit line. If the result of step 116 is false, the method 100 repeats step 114. If the result of step 116 is true, the trellis termination module 68 terminates the trellis in step 118 by generating final branch metrics for the last state transition based on the read signal of the last cell along the selected bit line and respective reference values.

In step 120, the path metric generator module 70 recursively generates cumulative path metrics for paths entering each state by adding branch metrics entering each state to the cumulative path metrics of paths entering that state using the Viterbi detector. The survivor path selection module 72 selects the path having the smallest cumulative path metric as the survivor path in step 122. The state selection module 74 selects the sequence of states connected by the survivor path in step 124. The state selection module 74 generates the data bits from the selected sequence of states in step 126, where the data bits are accurate estimates of the data stored in the cells although inter-cell interference is present when the data is read from the cells.

The sequence detector module 56 determines in step 128 whether the read module 54 read the last bit line. If the result of step 128 is false, the method 100 returns to step 108. If the result of step 128 is true, the sequence detector module 56 outputs words of data bits in step 130 based on the data bits detected from all bit lines, where the words accurately represent the data words stored in the cells 20. The method 100 ends in step 132.

Figure 6A:
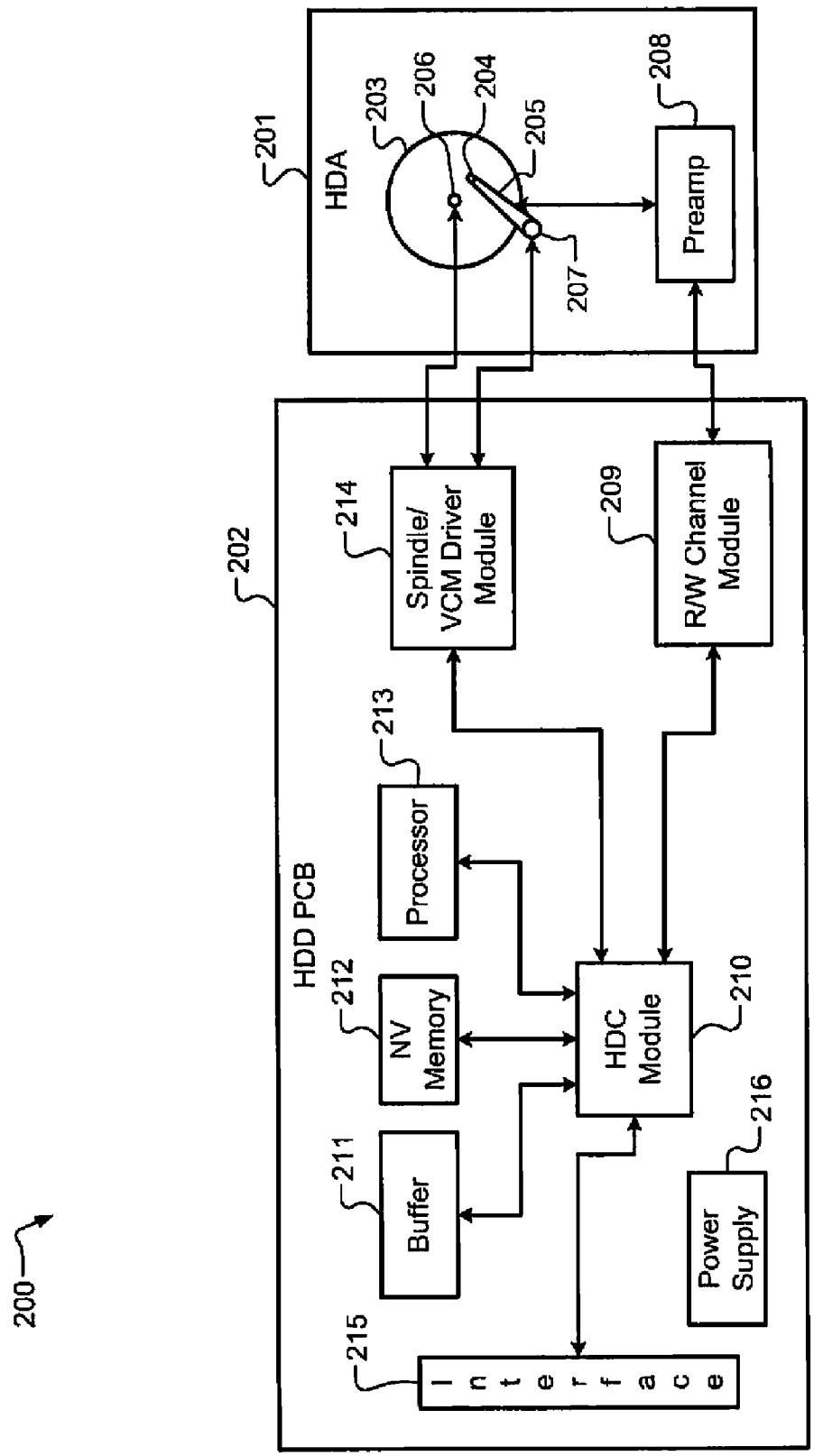
FIG. 6A is a functional block diagram of a hard disk drive.

Referring now to FIGS. 6A-6G, various exemplary implementations incorporating the teachings of the present disclosure are shown. In FIG. 6A, the teachings of the disclosure can be implemented in nonvolatile memory 212 of a hard disk drive (HDD) 200. The HDD 200 includes a hard disk assembly (HDA) 201 and an HDD printed circuit board (PCB) 202. The HDA 201 may include a magnetic medium 203, such as one or more platters that store data, and a read/write device 204. The read/write device 204 may be arranged on an actuator arm 205 and may read and write data on the magnetic medium 203. Additionally, the HDA 201 includes a spindle motor 206 that rotates the magnetic medium 203 and a voice-coil motor (VCM) 207 that actuates the actuator arm 205. A preamplifier device 208 amplifies signals generated by the read/write device 204 during read operations and provides signals to the read/write device 204 during write operations.

The HDD PCB 202 includes a read/write channel module (hereinafter, "read channel") 209, a hard disk controller (HDC) module 210, a buffer 211, nonvolatile memory 212, a processor 213, and a spindle/VCM driver module 214. The read channel 209 processes data received from and transmitted to the preamplifier device 208. The HDC module 210 controls components of the HDA 201 and communicates with an external device (not shown) via an I/O interface 215. The external device may include a computer, a multimedia device, a mobile computing device, etc. The I/O interface 215 may include wireline and/or wireless communication links.

The HDC module 210 may receive data from the HDA 201, the read channel 209, the buffer 211, nonvolatile memory 212, the processor 213, the spindle/VCM driver module 214, and/or the I/O interface 215. The processor 213 may process the data, including encoding, decoding, filtering, and/or formatting. The processed data may be output to the HDA 201, the read channel 209, the buffer 211, nonvolatile memory 212, the processor 213, the spindle/VCM driver module 214, and/or the I/O interface 215.

The HDC module 210 may use the buffer 211 and/or nonvolatile memory 212 to store data related to the control and operation of the HDD 200. The buffer 211 may include DRAM, SDRAM, etc. Nonvolatile memory 212 may include any suitable type of semiconductor or solid-state memory, such as flash memory (including NAND and NOR flash memory), phase change memory, magnetic RAM, and multi-state memory, in which each memory cell has more than two states. The spindle/VCM driver module 214 controls the spindle motor 206 and the VCM 207. The HDD PCB 202 includes a power supply 216 that provides power to the components of the HDD 200.

Figure 6B:
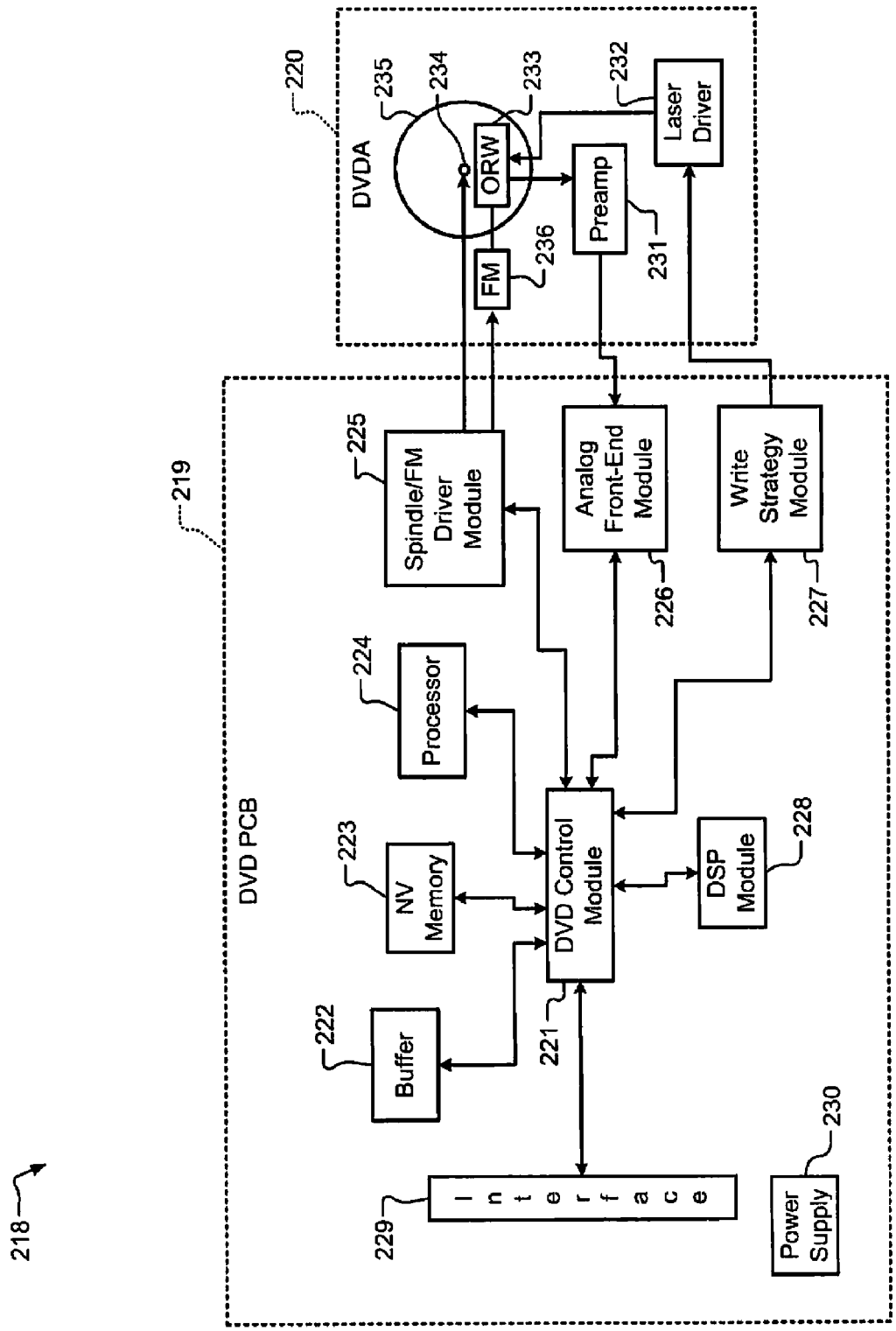
FIG. 6B is a functional block diagram of a DVD drive.

In FIG. 6B, the teachings of the disclosure can be implemented in nonvolatile memory 223 of a DVD drive 218 or of a CD drive (not shown). The DVD drive 218 includes a DVD PCB 219 and a DVD assembly (DVDA) 220. The DVD PCB 219 includes a DVD control module 221, a buffer 222, nonvolatile memory 223, a processor 224, a spindle/FM (feed motor) driver module 225, an analog front-end module 226, a write strategy module 227, and a DSP module 228.

The DVD control module 221 controls components of the DVDA 220 and communicates with an external device (not shown) via an I/O interface 229. The external device may include a computer, a multimedia device, a mobile computing device, etc. The I/O interface 229 may include wireline and/or wireless communication links.

The DVD control module 221 may receive data from the buffer 222, nonvolatile memory 223, the processor 224, the spindle/FM driver module 225, the analog front-end module 226, the write strategy module 227, the DSP module 228, and/or the I/O interface 229. The processor 224 may process the data, including encoding, decoding, filtering, and/or formatting. The DSP module 228 performs signal processing, such as video and/or audio coding/decoding. The processed data may be output to the buffer 222, nonvolatile memory 223, the processor 224, the spindle/FM driver module 225, the analog front-end module 226, the write strategy module 227, the DSP module 228, and/or the I/O interface 229.

The DVD control module 221 may use the buffer 222 and/or nonvolatile memory 223 to store data related to the control and operation of the DVD drive 218. The buffer 222 may include DRAM, SDRAM, etc. Nonvolatile memory 223 may include any suitable type of semiconductor or solid-state memory, such as flash memory (including NAND and NOR flash memory), phase change memory, magnetic RAM, and multi-state memory, in which each memory cell has more than two states. The DVD PCB 219 includes a power supply 230 that provides power to the components of the DVD drive 218.

The DVDA 220 may include a preamplifier device 231, a laser driver 232, and an optical device 233, which may be an optical read/write (ORW) device or an optical read-only (OR) device. A spindle motor 234 rotates an optical storage medium 235, and a feed motor 236 actuates the optical device 233 relative to the optical storage medium 235.

When reading data from the optical storage medium 235, the laser driver provides a read power to the optical device 233. The optical device 233 detects data from the optical storage medium 235, and transmits the data to the preamplifier device 231. The analog front-end module 226 receives data from the preamplifier device 231 and performs such functions as filtering and A/D conversion. To write to the optical storage medium 235, the write strategy module 227 transmits power level and timing data to the laser driver 232. The laser driver 232 controls the optical device 233 to write data to the optical storage medium 235.

Figure 6D:
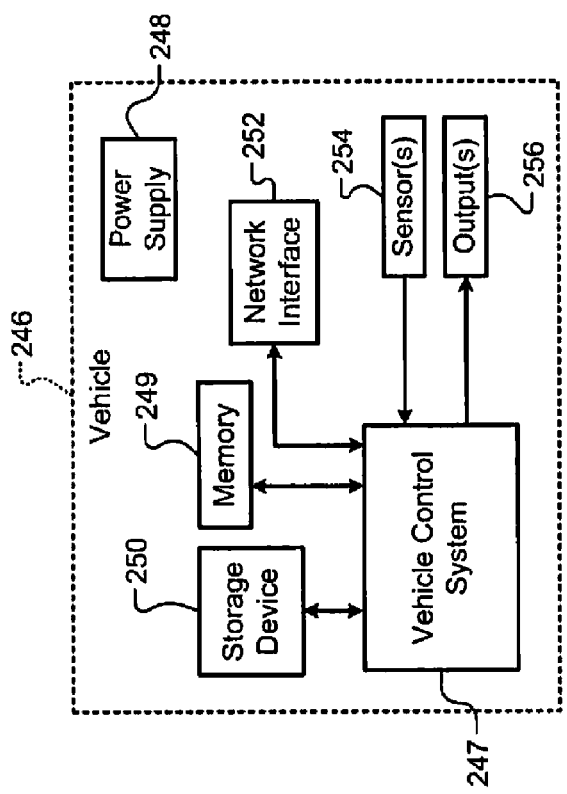
FIG. 6D is a functional block diagram of a vehicle control system.
Figure 6C:
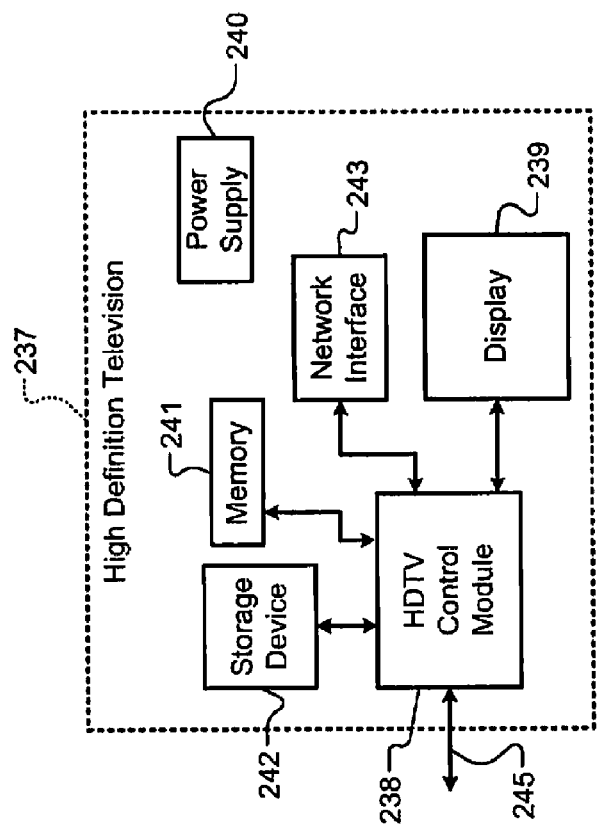
FIG. 6C is a functional block diagram of a high definition television.

In FIG. 6C, the teachings of the disclosure can be implemented in nonvolatile portion of memory 241 of a high definition television (HDTV) 237. The HDTV 237 includes an HDTV control module 238, a display 239, a power supply 240, memory 241, a storage device 242, a network interface 243, and an external interface 245. If the network interface 243 includes a wireless local area network interface, an antenna (not shown) may be included.

The HDTV 237 can receive input signals from the network interface 243 and/or the external interface 245, which can send and receive data via cable, broadband Internet, and/or satellite. The HDTV control module 238 may process the input signals, including encoding, decoding, filtering, and/or formatting, and generate output signals. The output signals may be communicated to one or more of the display 239, memory 241, the storage device 242, the network interface 243, and the external interface 245.

Memory 241 may include random access memory (RAM) and/or nonvolatile memory. Nonvolatile memory may include any suitable type of semiconductor or solid-state memory, such as flash memory (including NAND and NOR flash memory), phase change memory, magnetic RAM, and multi-state memory, in which each memory cell has more than two states. The storage device 242 may include an optical storage drive, such as a DVD drive, and/or a hard disk drive (HDD). The HDTV control module 238 communicates externally via the network interface 243 and/or the external interface 245. The power supply 240 provides power to the components of the HDTV 237.

In FIG. 6D, the teachings of the disclosure may be implemented in nonvolatile portion of memory 249 of a vehicle 246. The vehicle 246 may include a vehicle control system 247, a power supply 248, memory 249, a storage device 250, and a network interface 252. If the network interface 252 includes a wireless local area network interface, an antenna (not shown) may be included. The vehicle control system 247 may be a powertrain control system, a body control system, an entertainment control system, an anti-lock braking system (ABS), a navigation system, a telematics system, a lane departure system, an adaptive cruise control system, etc.

The vehicle control system 247 may communicate with one or more sensors 254 and generate one or more output signals 256. The sensors 254 may include temperature sensors, acceleration sensors, pressure sensors, rotational sensors, airflow sensors, etc. The output signals 256 may control engine operating parameters, transmission operating parameters, suspension parameters, brake parameters, etc.

The power supply 248 provides power to the components of the vehicle 246. The vehicle control system 247 may store data in memory 249 and/or the storage device 250. Memory 249 may include random access memory (RAM) and/or nonvolatile memory. Nonvolatile memory may include any suitable type of semiconductor or solid-state memory, such as flash memory (including NAND and NOR flash memory), phase change memory, magnetic RAM, and multi-state memory, in which each memory cell has more than two states. The storage device 250 may include an optical storage drive, such as a DVD drive, and/or a hard disk drive (HDD). The vehicle control system 247 may communicate externally using the network interface 252.

Figure 6F:
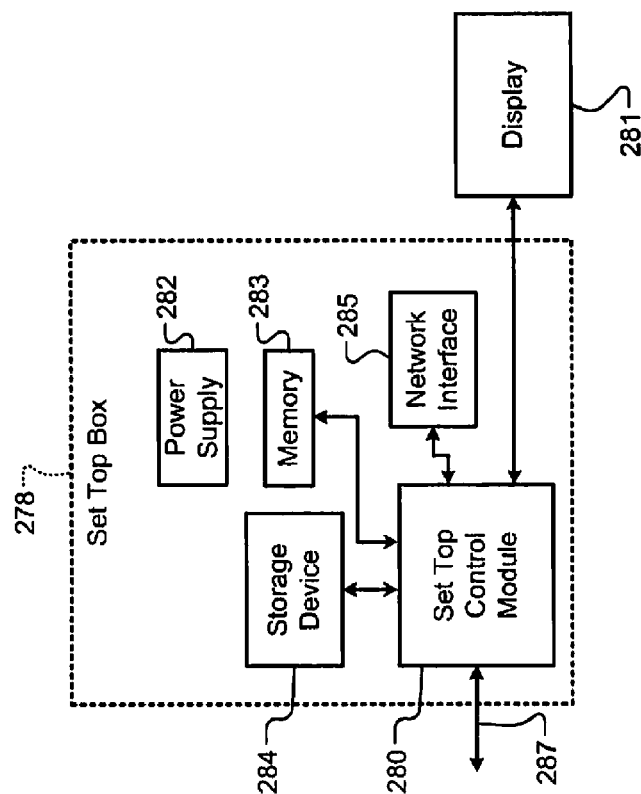
FIG. 6F is a functional block diagram of a set top box.
Figure 6E:
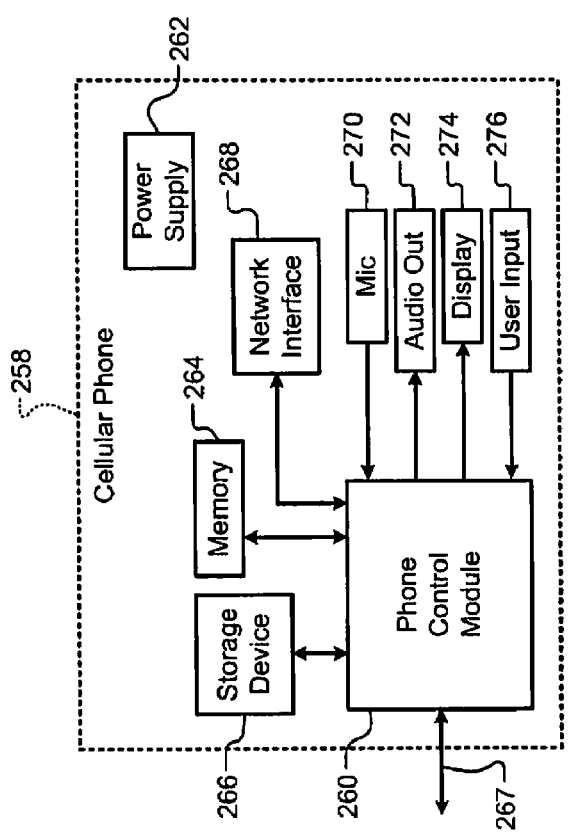
FIG. 6E is a functional block diagram of a cellular phone.

In FIG. 6E, the teachings of the disclosure can be implemented in nonvolatile portion of memory 264 of a cellular phone 258. The cellular phone 258 includes a phone control module 260, a power supply 262, memory 264, a storage device 266, and a cellular network interface 267. The cellular phone 258 may include a network interface 268, a microphone 270, an audio output 272 such as a speaker and/or output jack, a display 274, and a user input device 276 such as a keypad and/or pointing device. If the network interface 268 includes a wireless local area network interface, an antenna (not shown) may be included.

The phone control module 260 may receive input signals from the cellular network interface 267, the network interface 268, the microphone 270, and/or the user input device 276. The phone control module 260 may process signals, including encoding, decoding, filtering, and/or formatting, and generate output signals. The output signals may be communicated to one or more of memory 264, the storage device 266, the cellular network interface 267, the network interface 268, and the audio output 272.

Memory 264 may include random access memory (RAM) and/or nonvolatile memory. Nonvolatile memory may include any suitable type of semiconductor or solid-state memory, such as flash memory (including NAND and NOR flash memory), phase change memory, magnetic RAM, and multi-state memory, in which each memory cell has more than two states. The storage device 266 may include an optical storage drive, such as a DVD drive, and/or a hard disk drive (HDD). The power supply 262 provides power to the components of the cellular phone 258.

In FIG. 6F, the teachings of the disclosure can be implemented in nonvolatile portion of memory 283 of a set top box 278. The set top box 278 includes a set top control module 280, a display 281, a power supply 282, memory 283, a storage device 284, and a network interface 285. If the network interface 285 includes a wireless local area network interface, an antenna (not shown) may be included.

The set top control module 280 may receive input signals from the network interface 285 and an external interface 287, which can send and receive data via cable, broadband Internet, and/or satellite. The set top control module 280 may process signals, including encoding, decoding, filtering, and/or formatting, and generate output signals. The output signals may include audio and/or video signals in standard and/or high definition formats. The output signals may be communicated to the network interface 285 and/or to the display 281. The display 281 may include a television, a projector, and/or a monitor.

The power supply 282 provides power to the components of the set top box 278. Memory 283 may include random access memory (RAM) and/or nonvolatile memory. Nonvolatile memory may include any suitable type of semiconductor or solid-state memory, such as flash memory (including NAND and NOR flash memory), phase change memory, magnetic RAM, and multi-state memory, in which each memory cell has more than two states. The storage device 284 may include an optical storage drive, such as a DVD drive, and/or a hard disk drive (HDD).

Figure 6G:
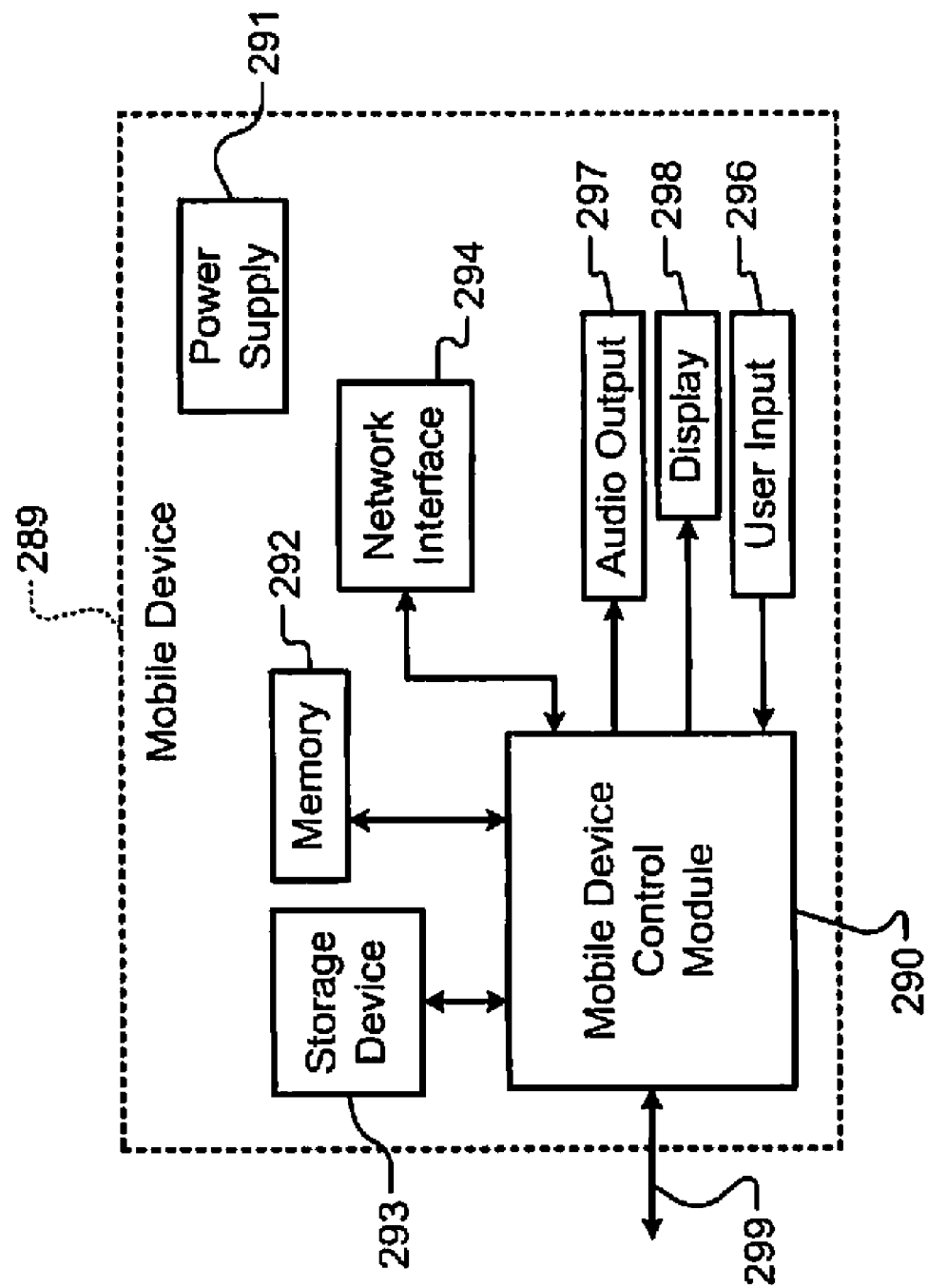
FIG. 6G is a functional block diagram of a mobile device.

In FIG. 6G, the teachings of the disclosure can be implemented in nonvolatile portion of memory 292 of a mobile device 289. The mobile device 289 may include a mobile device control module 290, a power supply 291, memory 292, a storage device 293, a network interface 294, and an external interface 299. If the network interface 294 includes a wireless local area network interface, an antenna (not shown) may be included.

The mobile device control module 290 may receive input signals from the network interface 294 and/or the external interface 299. The external interface 299 may include USB, infrared, and/or Ethernet. The input signals may include compressed audio and/or video, and may be compliant with the MP3 format. Additionally, the mobile device control module 290 may receive input from a user input 296 such as a keypad, touchpad, or individual buttons. The mobile device control module 290 may process input signals, including encoding, decoding, filtering, and/or formatting, and generate output signals.

The mobile device control module 290 may output audio signals to an audio output 297 and video signals to a display 298. The audio output 297 may include a speaker and/or an output jack. The display 298 may present a graphical user interface, which may include menus, icons, etc. The power supply 291 provides power to the components of the mobile device 289. Memory 292 may include random access memory (RAM) and/or nonvolatile memory.

Nonvolatile memory may include any suitable type of semiconductor or solid-state memory, such as flash memory (including NAND and NOR flash memory), phase change memory, magnetic RAM, and multi-state memory, in which each memory cell has more than two states. The storage device 293 may include an optical storage drive, such as a DVD drive, and/or a hard disk drive (HDD). The mobile device may include a personal digital assistant, a media player, a laptop computer, a gaming console, or other mobile computing device.

Those skilled in the art can now appreciate from the foregoing description that the broad teachings of the disclosure can be implemented in a variety of forms. Therefore, while this disclosure includes particular examples, the true scope of the disclosure should not be so limited since other modifications will become apparent upon a study of the drawings, the specification, and the following claims.

What is claimed is:
1. A system comprising:
    a reference generator module configured to respectively generate a plurality of reference signals for a plurality of memory cells located along a bit line or a word line, wherein a first reference signal of the plurality of reference signals for a first memory cell of the plurality of memory cells includes (i) a first signal and (ii) a second signal, wherein the first signal is free of interference from a second memory cell adjacent to the first memory cell along the bit line or the word line, and wherein the second signal includes interference from the second memory cell;

a read module configured to (i) read the plurality of memory cells, and (ii) generate a plurality of read signals; and a sequence detector module configured to detect a data sequence based on (i) the plurality of read signals and (ii) the plurality of reference signals, wherein the data sequence includes data stored in the plurality of memory cells.

2. The system of claim 1, wherein the plurality of memory cells comprise NAND flash memory cells configured to store one or more bits.

3. The system of claim 1, wherein the first reference signal of the plurality of reference signals includes a third signal, wherein the third signal includes interference from a third memory cell adjacent to the first memory cell along the bit line or the word line.

4. The system of claim 1, wherein the sequence detector module is configured to detect the data sequence using (i) a Viterbi detector, (ii) a decision feedback equalizer (DFE), or (iii) a fixed-depth delay tree-search with DFE.

5. The system of claim 1, wherein the reference generator module is configured to generate the reference signals by (i) writing reference data to the plurality of memory cells and (ii) reading the plurality of memory cells.

6. The system of claim 1, wherein the sequence detector module further comprises:
a trellis generator module configured to
generate a trellis,
wherein the trellis includes states, and
wherein each of the states comprises data from adjacent ones of the plurality of memory cells; and
a trellis initialization module configured to
initialize the trellis based on (i) a first of the plurality of read signals generated by reading a first of the plurality of memory cells and (ii) the reference signals corresponding to the first of the plurality of memory cells, and
generate initial path metrics for paths of the trellis, wherein the paths selectively connect the states.

7. The system of claim 6, wherein the initial path metrics include squared Euclidean distances between (i) the first of the plurality of read signals and (ii) the reference signals corresponding to the first of the plurality of memory cells.

8. The system of claim 6, wherein the sequence detector module further comprises:
a branch metric generator module configured to generate branch metrics for branches of the trellis,
wherein the branches connect a first one of the states to a second one of the states in response to the first one of the states transitioning to the second one of the states based on the plurality of read signals.

9. The system of claim 8, wherein the branch metrics include squared Euclidean distances between (i) the plurality of read signals generated by reading a second through a penultimate of the plurality of memory cells and (ii) the reference signals corresponding to the second through the penultimate of the plurality of memory cells.

10. The system of claim 8, wherein the sequence detector module further comprises a trellis termination module configured to:
terminate the trellis based on (i) a last of the plurality of read signals generated by reading a last of the plurality of memory cells and (ii) the reference signals corresponding to the last of the plurality of memory cells, and
generate final branch metrics.

11. The system of claim 10, wherein the final branch metrics include squared Euclidean distances between (i) the last of the plurality of read signals and (ii) the reference signals corresponding to the last of the plurality of memory cells.

12. The system of claim 10, wherein the sequence detector module further comprises a path metric generator module configured to generate cumulative path metrics based on (i) the initial path metrics, (ii) the branch metrics, and (iii) the final branch metrics.

13. The system of claim 12, wherein the sequence detector module further comprises:
a survivor path selection module configured to select one of the paths having a smallest of the cumulative path metrics as a survivor path; and
a state selection module configured to
select a sequence of N of the states connected by the survivor path, and
generate the data sequence from the sequence of N of the states,
where N is a number of the plurality of memory cells.

14. The system of claim 12, wherein the sequence detector module further comprises:
a survivor path selection module configured to select one of the paths having a smallest of the cumulative path metrics as a survivor path before the trellis is terminated; and
a state selection module configured to
select a sequence of less than N of the states connected by the survivor path, and
generate the data sequence from the sequence of less than N of the states,
where N is a number of the plurality of memory cells.

15. The system of claim 1, wherein the data sequence includes N bits of the data when the plurality of memory cells are located along the word line, where N is a number of the plurality of memory cells.

16. The system of claim 6, further comprising:
N bit lines, where N is an integer greater than 1,
wherein the plurality of memory cells are located along each of the N bit lines, and
wherein the sequence detector module is configured to
generate N data sequences in response to the read module reading the plurality of memory cells located along the N bit lines, and
generate a plurality of N-bit words.

17. A method comprising:
respectively generating a plurality of reference signals for a plurality of memory cells located along a bit line or a word line, wherein a first reference signal of the plurality of reference signals for a first memory cell of the plurality of memory cells includes (i) a first signal and (ii) a second signal, wherein the first signal is free of interference from a second memory cell adjacent to the first memory cell along the bit line or the word line, and wherein the second signal includes interference from the first memory cell;
reading the plurality of memory cells;
generating a plurality of read signals; and
detecting a data sequence based on (i) the plurality of read signals and (ii) the plurality of reference signals, wherein the data sequence includes data stored in the plurality of memory cells.

18. The method of claim 17, wherein the first reference signal includes a third signal, wherein the third signal includes interference from a third memory cell adjacent to the first memory cell along the bit line or the word line.

19. The method of claim 17, further comprising detecting the data sequence using (i) a Viterbi detector, (ii) a decision feedback equalizer (DFE), or (iii) a fixed-depth delay tree-search with DFE.

20. The method of claim 17, further comprising generating the reference signals by (i) writing reference data to the plurality of memory cells and (ii) reading the plurality of memory cells.

* * * * *